United States Patent [19]

Iwane

[11] Patent Number: 5,208,550
[45] Date of Patent: May 4, 1993

[54] RADIO-FREQUENCY POWER AMPLIFIER DEVICE

[75] Inventor: Yasushi Iwane, Amagasaki, Japan

[73] Assignee: Mitsubishi Denki Kabushiki Kaisha, Tokyo, Japan

[21] Appl. No.: 863,119

[22] Filed: Apr. 3, 1992

[30] Foreign Application Priority Data

Apr. 16, 1991 [JP] Japan .................................. 3-109626

[51] Int. Cl.$^5$ .............................................. H03G 3/20
[52] U.S. Cl. .................................... 330/129; 330/279; 455/126
[58] Field of Search ............... 330/127, 129, 134, 279; 435/116, 126, 127

[56] References Cited

U.S. PATENT DOCUMENTS

| | | | |
|---|---|---|---|
| 4,307,348 | 12/1981 | Nicholson | 330/279 X |
| 4,476,437 | 10/1984 | Fujiwara | 330/279 X |
| 4,523,155 | 6/1985 | Walczak et al. | 330/279 |
| 4,709,403 | 11/1987 | Kikuchi | 330/279 X |
| 5,086,508 | 2/1992 | Furuno | 455/69 |
| 5,117,202 | 5/1992 | Tsuruoka | 330/279 |
| 5,126,686 | 6/1992 | Tam | 330/279 |

FOREIGN PATENT DOCUMENTS

| | | | |
|---|---|---|---|
| 62609 | 4/1982 | Japan | 330/138 |
| 21011 | 8/1990 | Japan | 330/127 |

*Primary Examiner*—James B. Mullins
*Attorney, Agent, or Firm*—Rothwell, Figg, Ernst & Kurz

[57] ABSTRACT

In a radio-frequency power amplifier device, having a radio-frequency power amplifier for an input RF signal, part of the output signal of the amplifier is extracted, and the extracted voltage is compared with a reference voltage to apply a negative feedback to the gain control terminal of the power amplifier, thereby to stabilize the output power. The output power value is switched in accordance with a power level control signal. A variable attenuator or a variable-coupling-coefficient coupling means provided in front of the detector circuit switches the attenuation or the coupling coefficient depending on the power level, such that the magnitude of the input to the detector circuit is maintained at a constant level. The detector circuit therefore operates at the same operating point regardless of the switching of the power level, and the dynamic range required of the detector circuit may be narrow. The temperature variation of the output power at the time of low power output is small.

8 Claims, 4 Drawing Sheets

RADIO-FREQUENCY POWER AMPLIFIER DEVICE

BACKGROUND OF THE INVENTION

The present invention relates to a radio-frequency power amplifier device used in a radio transmitter, and in particular to a radio-frequency power amplifier device in which the output power is automatically controlled to be constant.

FIG. 4 is a block diagram showing a prior-art radio-frequency power amplifier device for receiving and amplifying a radio-frequency input signal 1 (hereafter referred to as RF input signal). As illustrated, it comprises a radio-frequency power amplifier 2 having a gain control terminal 3 for varying the gain of the power amplifier 2 and producing an amplified radio-frequency output signal (hereinafter referred to as RF output signal) 4, a coupling capacitor 5 for extracting part of the RF output signal 4, a detector circuit 6 comprised of diodes and a smoothing circuit for detecting the radio-frequency signal and producing a detected voltage output 7, a reference voltage setting circuit 8 for outputting a reference voltage 8a corresponding to the power level that has been set in accordance with a power level switch control signal 10a supplied from a controller 10 and used for switching the output power, and a comparator/low-pass filter circuit 9 comparing the detected voltage 7 with the reference voltage 8a and having a low-pass filter (LPF) characteristics.

In operation, the RF input signal 1 is power-amplified by the power amplifier 2 to become the RF output signal 4. Part of the RF output signal 4 is input to the detector circuit 6 via the coupling capacitor 5. The detector circuit 6 performs the peak-detection, and outputs the detected voltage 7 corresponding to the magnitude of the RF output signal 4. The comparator/LPF circuit 9 compares the detected voltage 7 with the reference voltage 8a to detect their difference or error between them, and passes the error signal through the LPF to smooth it, and then outputs it. The error signal 9a output from the comparator/LPF circuit 9 is input to the gain control terminal 3 provided on the power amplifier 3.

The path from the coupling capacitor 5 through the comparator/LPF circuit 9 to the gain control terminal 3 forms a negative feedback circuit. When the RF output signal 4 becomes larger than the target value, the detected voltage 7 increases and a negative error signal is created to reduce the gain of the power amplifier 2. When the RF output signal 4 becomes smaller, a positive error signal is created, and the gain of the power amplifier 2 is increased. In this way, the RF output power is automatically controlled to be constant.

The reference voltage setting circuit 8 has a power level switching input terminal for permitting the target value to be set from the controller 10. By such setting, different set voltages can be output. Accordingly, any one of a plurality of output power values (power levels), from a low-power output to a high-power output, that is set by means of the controller 10, can be selected.

Because the prior-art radio-frequency power amplifier device is configured as described above, when the output power (power level) is switched, the magnitude of the signal input to the detector circuit 6 also varies. Accordingly, the detector circuit 6 must have a wide dynamic range to cope with all the power levels. As a result, when a low-power output is set, the detected voltage 7 is minute, and the temperature variation of the forward-voltage of the detector diodes forming the detector circuit 6 gives a large influence on the output power value.

SUMMARY OF THE INVENTION

The present invention has been made to eliminate the problems described above, and its object is to provide a radio-frequency power amplifier device enabling a variable (switching) control from a low power to a high power without widening the dynamic range of the detector circuit, and reducing the temperature variation in the output value at the time of low power output.

The radio-frequency power amplifier device according to the invention is provided with an extracting means for maintaining the input to the detector circuit at a constant level, and the input level to the detector circuit is not varied even if the power level is switched.

As the input to the detector circuit is maintained at a constant level by the function of the extracting means, the diodes in the detector circuit perform the detection at the same operating point regardless of the output power. As opposed to the prior art, wide dynamic ranges are not required, and a sufficient detected voltage is obtained even at the time of low-power output, so the effect of the temperature characteristics of the diode forward voltage on the output is reduced.

DETAILED DESCRIPTION OF THE PREFERRED EMBODIMENTS

Embodiment 1

Figure 1:
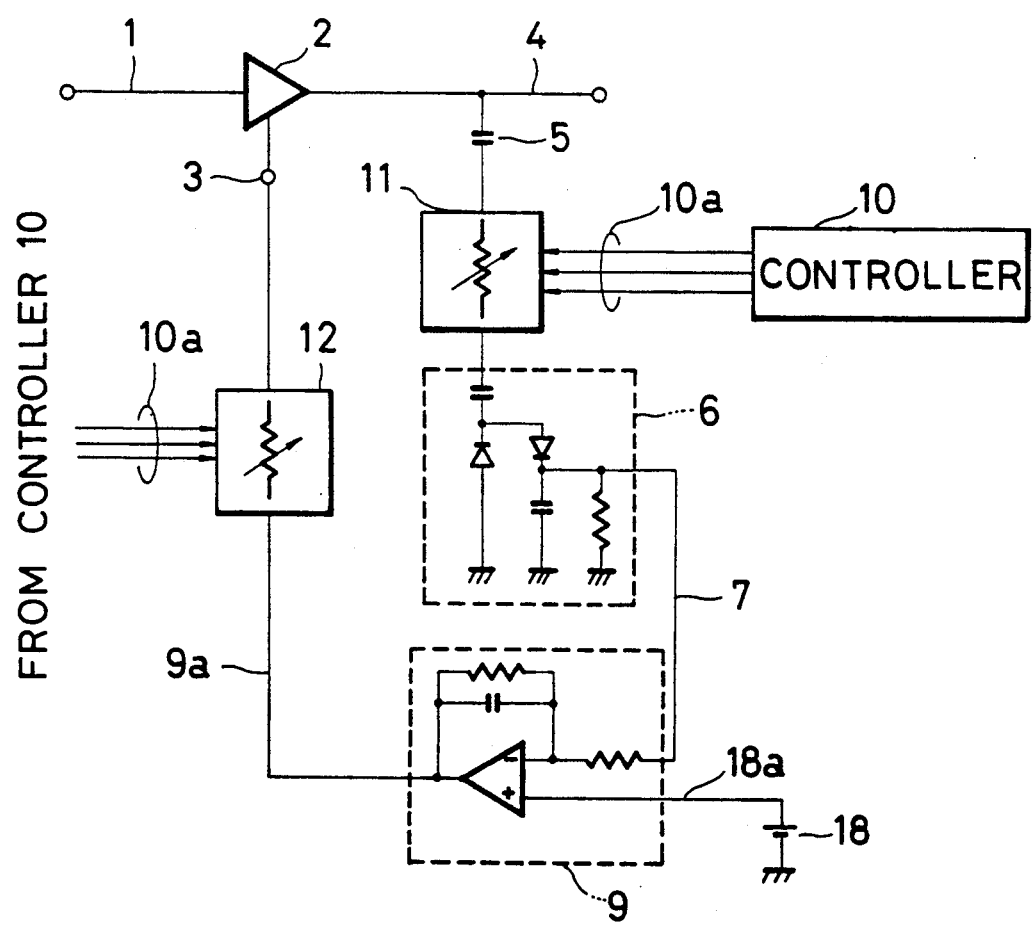
FIG. 1 is a block diagram showing a radio-frequency power amplifier device of a first embodiment of the invention.
Figure 4:
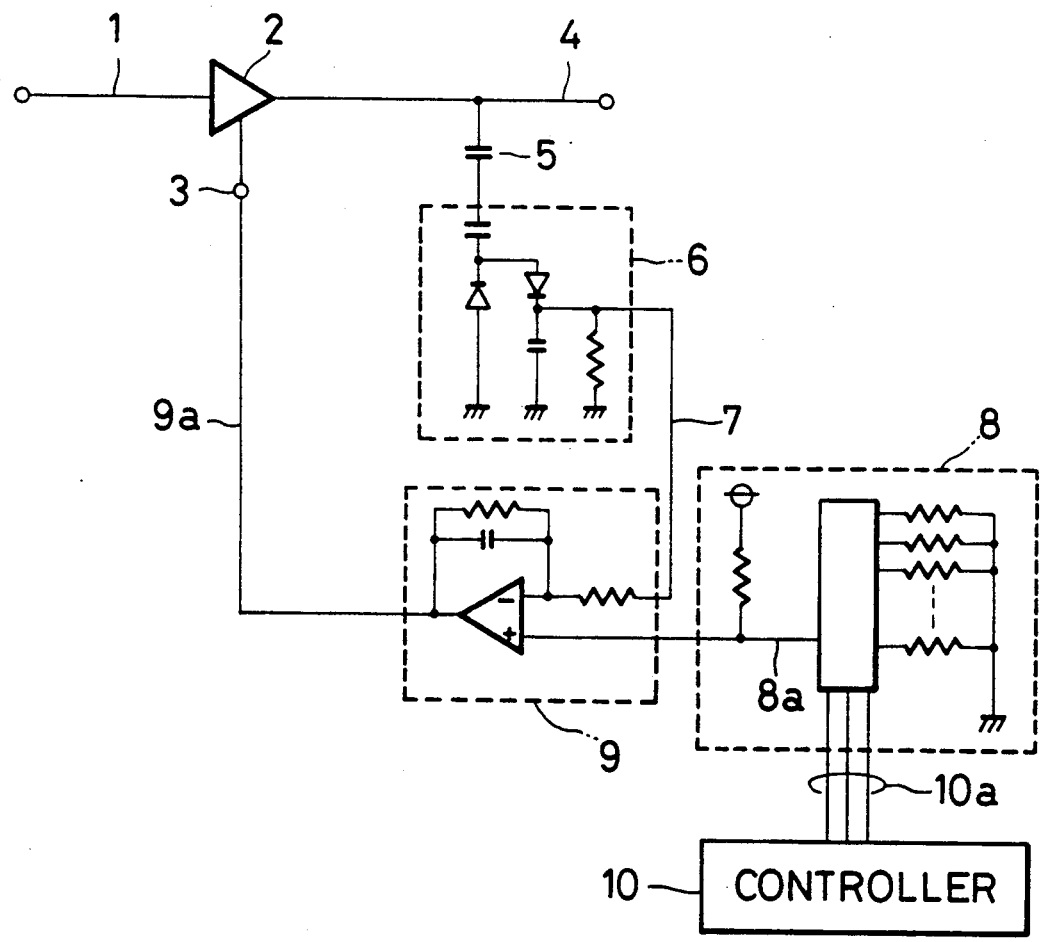
FIG. 4 is a block diagram showing a radio-frequency power amplifier device in the prior art.

A first embodiment, Embodiment 1, of the invention will now be described with reference to FIG. 1. The parts which correspond to those in FIG. 4 are given identical reference numerals, and their description will be omitted.

The Embodiment 1 differs from the prior-art device in that a variable attenuator 11 is provided between the coupling capacitor 5 and the detector circuit 6 and having its attenuation controlled in accordance with the power level switch control signal 10a. Another variable attenuator 12 is provided between the comparator/LPF circuit 9 and the gain control terminal 3 and having its attenuation controlled by the power level switch control signal 10a. In place of the reference voltage setting circuit 8 in FIG. 4, which outputs the reference voltage 8a corresponding to the power level that has been set in accordance with the power level switch control signal 10a, a reference voltage setting circuit 18 generating a reference voltage 18a of a fixed value.

The gain control terminal 3 constitutes the output power adjusting means, the capacitor 5 constitutes the coupling means, the detector circuit 6 constitutes a radio-frequency detecting means, the comparator/LPF circuit 9 constitutes a comparing and smoothing means, and the variable attenuator 12 constitutes a feedback gain control means.

In operation, the RF input signal 1 is power-amplified by the power amplifier 2 to become the RF output signal 4. As in the prior art, part of the RF output signal 4 is extracted by means of the coupling capacitor 5, and subjected to the below-described processing, and a negative feedback is given to the gain control terminal 3 thereby to stabilize the output power.

The signal extracted by the coupling capacitor 5 is proportional to the RF output signal 4. The signal is input to the variable attenuator 11. The attenuation of the variable attenuator 11 is so controlled as to be large at the time of high power output and to be small at the time of low power output, so that the output of the variable attenuator 11 is at a constant level (within an invariable range) regardless of the output power (power level) of the radio-frequency power amplifier device.

The detector circuit 6 detects the output of the variable attenuator 11 and outputs the detected voltage 7. The magnitude of the input radio frequency signal to this detector circuit 6 is at a constant level regardless of the power level by virtue of the variable attenuator as described above, except for variations due to error. Accordingly, the detected voltage 7 is expected to be at a constant level regardless of the power level. As a result, the reference voltage 18a for use in comparison with the detected voltage 7 need not be switched according to the target power level. The reference voltage 18a and the detected voltage which are at a constant level regardless of the power level are compared and smoothed at the comparator/LPF circuit 9, to obtain an error signal 9a. The error signal 9a is fed back to the gain control terminal 3 through the variable attenuator 12 having its attenuation varied (switched) in accordance with the power level switch control signal 10a.

The variable attenuator 12 is operated such that the overall gain of the negative feed circuit does not vary with the power level. In accordance with the power level switch control signal 10a, the attenuation of the variable attenuator 12 as a feedback gain control means is set small at the time of high power output when the attenuation of the variable attenuator 11 is set large, and is set large at the time of low power output when the attenuation of the variable attenuator 11 is set small.

In the prior-art example described earlier, the magnitude of the input to the detector circuit 6 differs depending on the power level, and a problem was encountered in connection with the dynamic range of the detector circuit 6 wherein at the time of high power input, the detector diodes in the detector circuit 6 may be overloaded, and at the time of low power output a sufficient detected voltage 7 is not obtained. In the Embodiment 1, the input to the detector circuit 6 is at a constant level regardless of the power level, and the wide dynamic range which was required for the detector circuit of the prior art is not necessary. In the prior-art example, at the time of lower power output, a sufficient detected voltage 7 was not obtained, and the temperature variation of the forward voltage drop of the detector diodes superimposed thereon is not negligible, and the temperature variation of the output power is larger than when the power output is high. In contrast, in the Embodiment 1, at the time of low power output, the detector circuit 6 is supplied with a signal of a sufficient magnitude, so the temperature variation at the time of the low power output is restrained.

Embodiment 2

Figure 2:
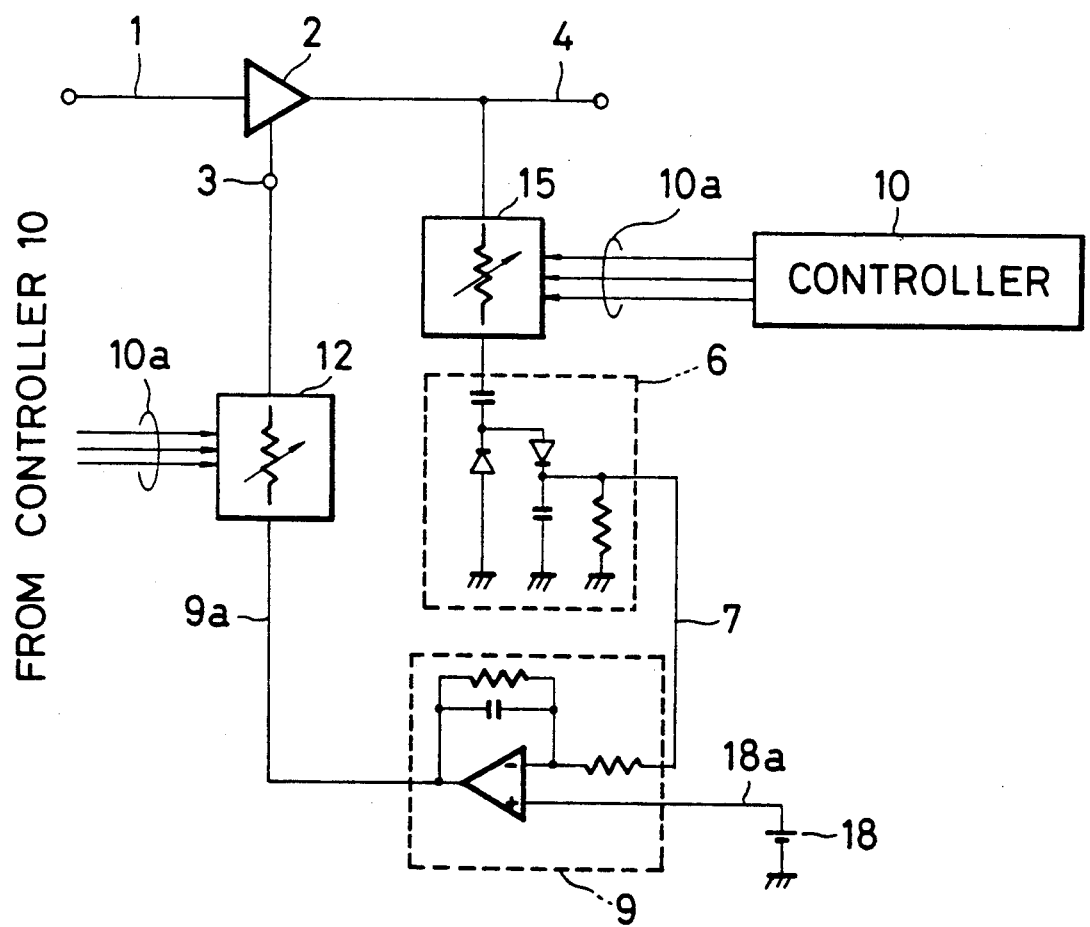
FIG. 2 is a block diagram showing a radio-frequency power amplifier device of another embodiment of the invention.

FIG. 2 is a block diagram showing a second embodiment, Embodiment 2, of the invention. The parts corresponding to those in FIG. 1 are given identical reference numerals.

The Embodiment 2 differs from the Embodiment 1 in that, in place of the coupling capacitor 5 and the variable attenuator 11, a variable coupling circuit 15 is provided as a means of coupling-coefficient-variable coupling means. It has a coupling coefficient varied by the power level switch control signal 10a, and extracts parts of the output power of the power amplifier 2 and applies it to the detector it to the detector circuit 6.

In the Embodiment 1, part of the output power is extracted with a fixed coupling coefficient and attenuated by means of the variable attenuator 11, so that the input to the detector circuit 6 is maintained at a constant level against the power level switching. In the Embodiment 2 of FIG. 2, the variable coupling circuit 15 is used so that the coupling coefficient itself is varied (switched). That is, the coupling coefficient is made small at the time of high power output and is made large at the time of low power output, so that the input to the detector circuit 6 is maintained at a constant level regardless of the power level.

Other parts operates in the same way as in the Embodiment 1 and the Embodiment 2 has the same effects as the Embodiment 1.

Embodiment 3

Figure 3:
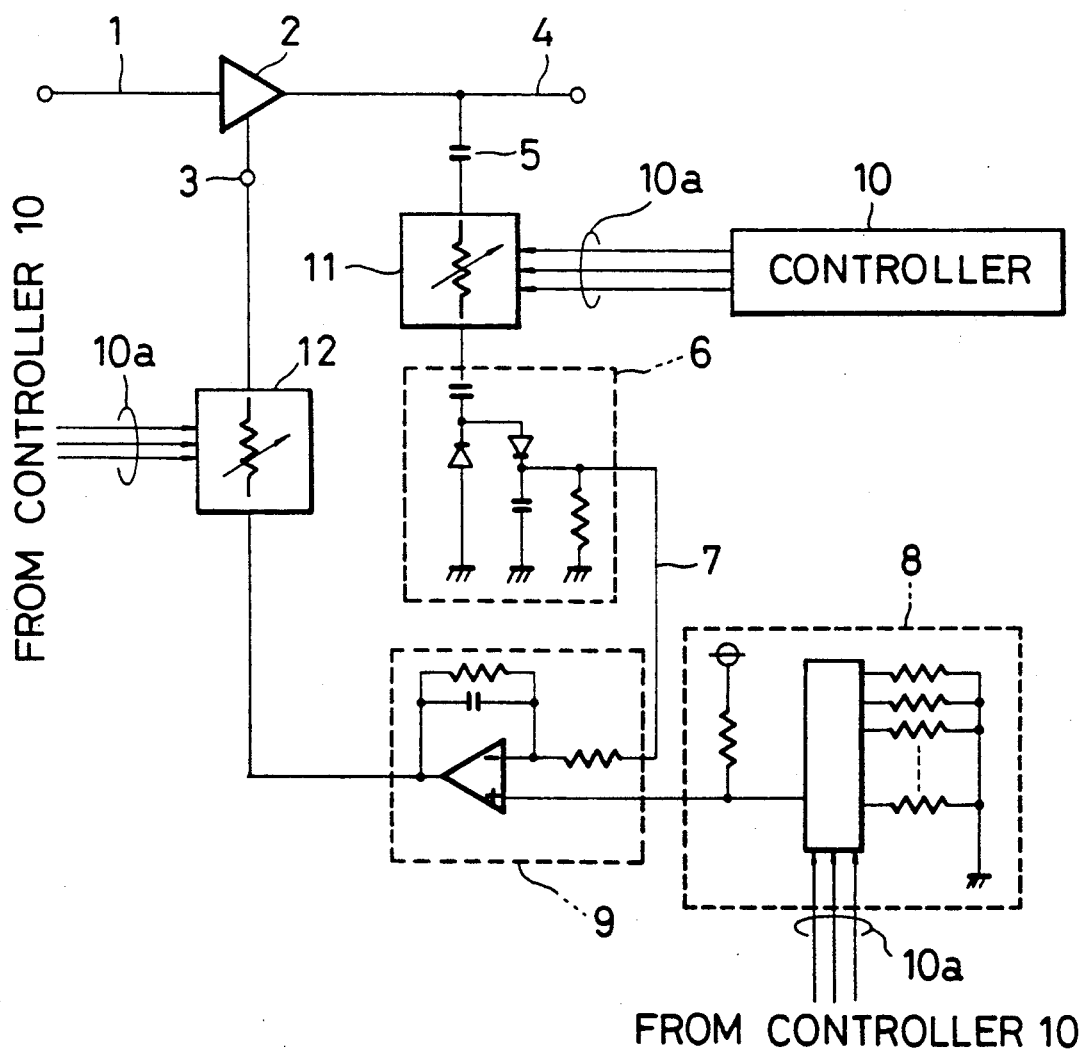
FIG. 3 is a block diagram showing a radio-frequency power amplifier device of a further embodiment of the invention.

FIG. 3 is a block diagram showing a further embodiment, Embodiment 3, of the invention. In the Embodiments 1 and 2 shown in FIG. 1 and FIG. 2, the variable attenuator 11 or the variable coupling circuit 15 are provided such that the signal input to the detector circuit 6 is maintained exactly at a constant level, i.e., within a range which is invariable against the power level switching. When the width of the variation is very large, the devices are difficult to configure or are expensive. In the Embodiment 3 of FIG. 3, the variable attenuator 11 operates so that the variation in the output when the power level is switched is restrained or reduced compared with the input, but not necessarily maintained within an invariable range. In other words, the range in which the input to the detector circuit may vary but the width of the variation is smaller than in the prior art. To cope with the variation in the detected voltage 7, a reference voltage setting circuit 8 having a variable reference voltage 8a is provided, and is switched in accordance with the power level switch control signal 10a.

In the Embodiment 3, since the range of operation of the detector circuit 6 is narrow compared with the prior art example, effects similar to those obtained in the Embodiments 1 and 2 are obtained. That is, the range required of the detector circuit may be narrower than in the prior art (although wider than in the Embodiments 1 and 2). Moreover, the reduction in the signal supplied to the detector circuit 6 at the time of low power output is restrained, so the effect of the temperature variation is reduced.

In the Embodiments 1 to 3, the feedback control signal is fed back to the gain control terminal 3 provided on the power amplifier 2, but some other methods may be employed. For instance, an additional variable attenuator may be provided in front of the power amplifier 2, and may be controlled to adjust the output power.

In the Embodiments 1 to 3, the variation of the gain of the feedback circuit is made by means of the variable attenuator 12, but some other methods may be employed. For example, the gain of the comparator/LPF circuit 9 may be switched.

As has been described, according to the invention, a variable attenuator or a coupling-coefficient-variable coupling means is provided in front of the detector circuit, and the variation in the input to the detector circuit is restrained or reduced even when the output power value is switched, and the range of operation of the detector circuit is limited. As a result, it is possible to obtain a device in which the dynamic range required of the detector circuit is narrowed, and the temperature variation of the output power at the time of the low power output is reduced.

What is claimed is:

1. A radio-frequency power amplifier device for producing an output whose magnitude is switched in accordance with a power level switch control signal, comprising:
    a radio-frequency power amplifier receiving an input signal and providing a power-amplified output signal;
    an extracting means for extracting part of the output power of the signal at the output of the radio-frequency power amplifier, and outputting a signal having a magnitude indicative of the magnitude of the output signal of the power amplifier and varied in accordance with said power level switch control signal;
    a high-frequency detecting means for detecting the magnitude of the output signal of the extracting means and outputting a detected voltage corresponding thereto;
    a comparing and smoothing means for comparing the detected voltage of the high-frequency detecting means with a predetermined reference voltage, and smoothing the difference;
    a feedback gain control means for controlling the magnitude of the output of the comparing and smoothing means; and
    an output power adjusting means for controlling the output power of the power amplifier in accordance with the output of the feedback gain control means;
    wherein said extracting means, said high-frequency detecting means, said comparing and smoothing means, said feedback gain control means and said output power adjusting means form a feedback loop to control the gain of said power amplifier in accordance with the output of the power amplifier; said feedback gain control means being controlled in accordance with said power level switch control signal so that the overall gain of said feedback loop is substantially constant.

2. The device of claim 1, wherein said extracting means comprises:
    a coupling means for extracting part of the output power of the radio-frequency power amplifier and outputting a signal corresponding to the magnitude of the output of the power amplifier; and
    a variable attenuator receiving the output signal from the coupling means, and having its attenuation varied in accordance with the power level switch control signal.

3. The device of claim 1, wherein said extracting means comprises a coupling-coefficient-variable coupling means having a coupling coefficient controlled in accordance with the power level switch control signal.

4. The device of claim 1, wherein said extracting means controls the magnitude of its output signal so as to be at a constant level regardless of the switching of the power level of the output of the device.

5. The device of claim 1, further comprising a means for varying the reference voltage in accordance with the power level switch control signal.

6. The device of claim 5, wherein said extracting means controls the magnitude of its output signal such that its variation with the switching of the power level of the output of the device is reduced.

7. A radio-frequency power amplifier device for producing an output whose magnitude is switched in accordance with a power level switch control signal, comprising:
    a radio-frequency power amplifier receiving and input signal and providing a power-amplified output signal;
    extracting means for extracting part of the output power of the signal at the output of the radio-frequency power amplifier, and outputting a signal having a magnitude indicative of the magnitude of the output signal of the power amplifier and varied in accordance with said power level switch control signal;
    high-frequency detecting means for detecting the magnitude of the output signal of the extracting means and outputting a detected voltage corresponding thereto;
    comparing means for comparing the detected voltage of the high-frequency detecting means with a predetermined reference voltage;
    feedback gain control means for controlling the magnitude of the output of the comparing means in accordance with said power level switch control signal; and
    output power adjusting means for controlling the output power of the power amplifier in accordance with the output of the feedback gain control means.

8. In a radio-frequency power amplifier device having a radio-frequency power amplifier and a gain control circuit as a feedback loop for said power amplifier for controlling the gain of said power amplifier based on an output signal produced by said power amplifier, the improved in the gain control circuit comprising:
    variable extracting means for extracting part of the output signal of said power amplifier and producing a magnitude signal indicative of the magnitude of said output signal of said power amplifier, said magnitude signal being varied according to a power level switch control signal for controlling the output power of the output signal of said power amplifier; and
    variable gain control means for producing a gain control signal for controlling the gain of said power amplifier based on said magnitude signal produced by said variable extracting means, said gain control signal being varied according to said power level switch control signal in a direction opposite to that of the variation of said magnitude signal, such that the overall gain of said feedback loop is maintained substantially constant.

* * * * *